United States Patent
Yaung

(10) Patent No.: US 7,592,199 B2
(45) Date of Patent: Sep. 22, 2009

(54) METHOD FOR FORMING PINNED PHOTODIODE RESISTANT TO ELECTRICAL LEAKAGE

(75) Inventor: Dun-Nian Yaung, Taipei (TW)

(73) Assignee: Taiwan Semiconductor Manufacturing Co., Ltd, Hsin-Chu (TW)

( * ) Notice: Subject to any disclaimer, the term of this patent is extended or adjusted under 35 U.S.C. 154(b) by 43 days.

(21) Appl. No.: 12/011,943

(22) Filed: Jan. 29, 2008

(65) Prior Publication Data
US 2008/0124829 A1 May 29, 2008

Related U.S. Application Data

(62) Division of application No. 11/007,935, filed on Dec. 9, 2004, now Pat. No. 7,348,651.

(51) Int. Cl.
*H01L 21/329* (2006.01)
(52) U.S. Cl. ............. 438/73; 438/237; 438/433; 257/656; 257/E29.336; 257/E21.36
(58) Field of Classification Search ........... 438/73, 438/237, 433, FOR. 227; 257/656, E29.336, 257/E21.36
See application file for complete search history.

(56) References Cited

U.S. PATENT DOCUMENTS

| | | | |
|---|---|---|---|
| 5,859,450 A | | 1/1999 | Clark et al. |
| 6,297,070 B1 | | 10/2001 | Lee et al. |
| 6,410,359 B2 | | 6/2002 | Connolly et al. |
| 6,753,202 B2 * | | 6/2004 | Chen et al. ............ 438/48 |
| 6,812,539 B1 * | | 11/2004 | Rhodes ............ 257/435 |
| 6,878,568 B1 * | | 4/2005 | Rhodes et al. ........... 438/73 |
| 6,888,214 B2 * | | 5/2005 | Mouli et al. ........... 257/510 |
| 6,897,082 B2 * | | 5/2005 | Rhodes et al. ........... 438/48 |
| 6,900,484 B2 * | | 5/2005 | Rhodes ............ 257/292 |
| 6,908,839 B2 * | | 6/2005 | Rhodes ............ 438/595 |
| 6,949,445 B2 * | | 9/2005 | Rhodes et al. ........... 438/424 |
| 7,064,406 B2 * | | 6/2006 | Mouli ............ 257/446 |
| 7,141,836 B1 * | | 11/2006 | Adkisson et al. ........... 257/233 |
| 7,217,589 B2 * | | 5/2007 | Rhodes et al. ........... 438/57 |
| 7,226,803 B2 * | | 6/2007 | Mouli et al. ........... 438/59 |

(Continued)

OTHER PUBLICATIONS

Kwon, Hyuck In, Dark Current Characterization of the CMOS APS Imagers Fabricated Using a 0.18 μm CMOS Technology, SMDL Annual Report 20003m, School of Electrical Eng., Seoul Nat'l Univ.

*Primary Examiner*—George Fourson
(74) *Attorney, Agent, or Firm*—Duane Morris LLP

(57) ABSTRACT

A method is provided for reducing or eliminating leakage between a pinned photodiode and shallow trench isolation structure fabricated therewith while optimizing the sensitivity of the photodiode. An N+ region is implanted in a P-type substrate and a P-type well separates the N+ region from the shallow trench isolation (STI) structure. At least a P+ region is formed over the N+ region and overlapping at least part of the P-type well and a substrate portion between the N+ region and P-type well. The space between the N+ region and a damaged region adjacent the STI is greater than the expansion distance of the depletion region between the N+ region and the P-type well. The junctions of the various features are optimized to maximize a photosensitive response for the wavelength of the absorbed light as well as for reducing or eliminating electrical leakage.

8 Claims, 2 Drawing Sheets

U.S. PATENT DOCUMENTS

| | | | |
|---|---|---|---|
| 7,262,110 B2 * | 8/2007 | Jin .............................. 257/431 |
| 7,262,400 B2 * | 8/2007 | Yaung ...................... 250/208.1 |
| 7,321,141 B2 * | 1/2008 | Sze ............................. 257/233 |
| 7,334,211 B1 * | 2/2008 | Toros et al. .................... 716/19 |
| 7,348,651 B2 * | 3/2008 | Yaung ......................... 257/446 |
| 7,385,232 B2 * | 6/2008 | Patrick ....................... 257/187 |
| 7,387,908 B2 * | 6/2008 | Patrick ......................... 438/73 |
| 7,402,451 B2 * | 7/2008 | Rhodes ......................... 438/60 |
| 7,432,148 B2 * | 10/2008 | Li et al. ...................... 438/218 |
| 7,468,532 B2 * | 12/2008 | McKee ....................... 257/292 |
| 7,470,560 B2 * | 12/2008 | Rhodes et al. ................ 438/73 |
| 7,491,561 B2 * | 2/2009 | Adkisson et al. .............. 438/30 |
| 7,492,027 B2 * | 2/2009 | Mouli ......................... 257/446 |
| 7,511,354 B2 * | 3/2009 | Rhodes et al. .............. 257/506 |
| 2003/0169359 A1 | 9/2003 | Merrill et al. |
| 2004/0021194 A1 | 2/2004 | Mann |
| 2005/0045926 A1 | 3/2005 | Mouli |
| 2005/0184321 A1 | 8/2005 | Luo |
| 2006/0125035 A1 | 6/2006 | Yaung |
| 2007/0023801 A1 * | 2/2007 | Hynecek ..................... 257/292 |
| 2007/0029469 A1 * | 2/2007 | Rhodes .................... 250/214 R |
| 2007/0031987 A1 * | 2/2007 | Mouli et al. ................... 438/57 |
| 2007/0034914 A1 * | 2/2007 | Cole et al. ................... 257/291 |
| 2007/0052055 A1 * | 3/2007 | McKee ....................... 257/462 |
| 2007/0057158 A1 * | 3/2007 | Hong ....................... 250/214.1 |
| 2007/0065970 A1 * | 3/2007 | Patrick et al. ................. 438/60 |
| 2007/0072333 A1 * | 3/2007 | Mouli et al. ................... 438/57 |
| 2007/0080424 A1 * | 4/2007 | Rhodes et al. ............. 257/506 |
| 2007/0096176 A1 * | 5/2007 | Mouli ......................... 257/291 |
| 2007/0102739 A1 * | 5/2007 | Chen et al. .................. 257/292 |
| 2007/0108371 A1 * | 5/2007 | Stevens et al. ........... 250/214.1 |
| 2007/0108476 A1 * | 5/2007 | Hong ......................... 257/225 |
| 2007/0125935 A1 * | 6/2007 | Yaung ...................... 250/208.1 |
| 2007/0158771 A1 * | 7/2007 | Hynecek ..................... 257/431 |
| 2007/0200181 A1 * | 8/2007 | Rhodes ....................... 257/384 |
| 2008/0124829 A1 * | 5/2008 | Yaung ......................... 438/57 |
| 2008/0179639 A1 * | 7/2008 | Gambino et al. ........... 257/291 |
| 2008/0265295 A1 * | 10/2008 | Brady ........................ 257/291 |
| 2009/0072337 A1 * | 3/2009 | Lee ............................. 257/440 |

* cited by examiner

METHOD FOR FORMING PINNED PHOTODIODE RESISTANT TO ELECTRICAL LEAKAGE

RELATED APPLICATION

This application is a divisional application of U.S. patent application Ser. No. 11/007,935, filed on Dec. 9, 2004, now U.S. Pat. No. 7,348,651 the contents of which are hereby incorporated by reference as if set forth in their entirety.

BACKGROUND

The present invention relates generally to integrated circuit designs, and more particularly to a system reducing or eliminating leakage between a pinned photodiode and shallow trench isolation fabricated therewith.

Semiconductor integrated circuit (IC) chips can be produced to function as image photosensors for image applications such as camera devices. A semiconductor photosensor produces signals that are proportional to light images by reading a predetermined number of individual pixels of an image. At least one device, such as a photodiode, is required for each pixel. By further incorporating a plurality of electronic reading and decoding circuitries, an array of image photosensors may digitally record an image with a predetermined pixel resolution.

Charge coupled devices (CCD) have been produced for this purpose with pinned photodiodes. In a pinned photodiode, a N+ region acts as a pixel sensor and is isolated from the surface of the IC by a P+ region. However, CCDs are typically difficult to integrate with logic circuits that might include metal-oxide-semiconductor field-effect-transistors (MOSFETs). Since MOSFETs are typically constructed with shallow trench isolation (STI), which is proved to be quite difficult to be integrated with pinned photodiodes, their mutual existence has been a challenging question for IC designers. In theory, STI is a device isolation structure of channels that are typically filled with oxide. The semiconductor crystal sidewalls of STI are damaged by the dry etch that is used to produce them. The sidewalls are further damaged by stresses that arise from the extreme temperature cycles that occur in semiconductor processing. The difficulty is that such damage causes electrical leakage if an electrical junction expands to such a damaged region.

Any electrical leakage appears as a signal in darkness. Such dark current reduces sensitivity and the quality of image depiction. Dark current can be generated by several typical structures in semiconductor devices. Electrical junctions that meet the oxide-covered surface are imperfect and can generate dark current. Shallow trench isolation between devices is produced by dry etching that damages the semiconductor crystal. If that damaged material is included in a junction depletion region, dark current can be generated.

Dark current is a bane of camera image quality. Therefore, desirable in the art of pinned photodiode designs are additional systems to integrate shallow trench isolation structures therewith, thereby improving image quality and overall IC performance. Prior attempts to reduce leakage and dark current typically do so at the expense of photodiode sensitivity. As such, it would be particularly desirable to provide a pinned photodiode that is resistant to leakage and dark current effects without compromising sensitivity.

SUMMARY

In view of the foregoing, the following provides a system and method to reduce or eliminate leakage between a pinned photodiode and shallow trench isolation fabricated therewith.

According to one aspect, provided is a method to reduce or eliminate electrical leakage between a pinned photodiode and shallow trench isolation fabricated therewith. The method comprises implanting N+ impurities to form an N+ region beneath a surface of a P-type semiconductor substrate, forming at least one shallow trench isolation (STI) structure in the semiconductor substrate and forming at least one P-type well laterally separating the N+ region from each STI structure wherein a substrate portion of the semiconductor substrate remains interposed between the N+ region and each P-type well and the P-type well includes a damaged portion adjacent the STI and facing the N+ region. The method further includes forming a P+ region covering the N+ region and each substrate portion and overlapping at least part of each P-type well, the P+ region formed within the semiconductor substrate and extending downwardly from the surface and creating an expandable depletion region along a boundary between the N+ region and the substrate portion. The method includes laterally spacing the N+ region from each adjacent damaged portion by a distance sufficient to prevent the depletion region from expanding into the associated damaged portion when the depletion region expands to a maximum expansion width. The N+ region has a lower boundary more than about 0.8 microns below the surface.

The sensitivities of the various pinned photodiodes may be optimized for the detection of different wavelengths of light. For example, for the detection of red light, the junction between the N+ region and the substrate may be about 0.8 microns or greater. For the optimal detection of blue light, the junction between the P+ region and the N+ region may be less than about 0.2 microns. For the detection of green light, the lower junction of the N+ region and the P-type wells may have the same depth of about 0.2 to 0.8 microns.

The construction and method of operation of the invention, however, together with additional objects and advantages thereof will be best understood from the following description of specific embodiments when read in connection with the accompanying drawings.

DESCRIPTION

The following will provide a detailed description of a system to reduce or eliminate leakage between a pinned photodiode and shallow trench isolation fabricated therewith.

Figure 1:
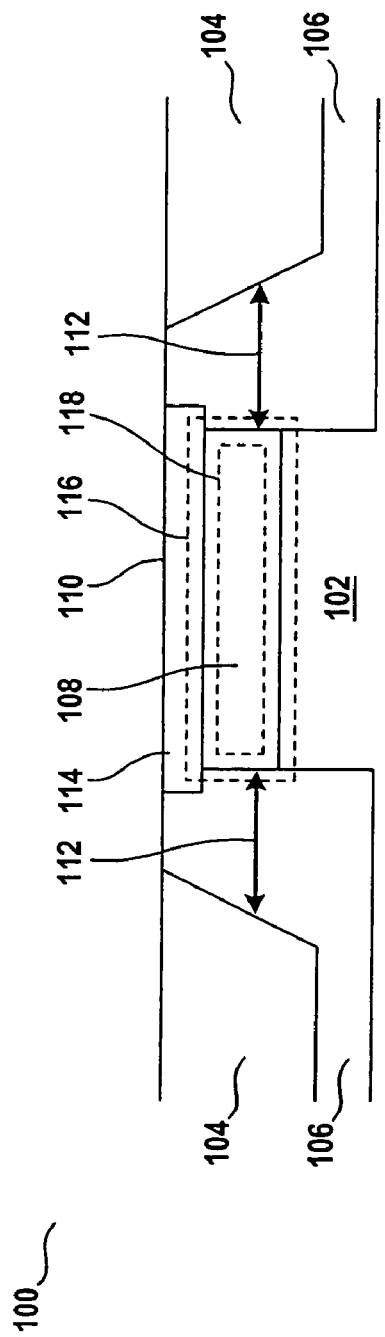
FIG. 1 illustrates a cross section of a conventional design with a pinned photodiode fabricated alongside a shallow trench isolation, according to the Prior Art.

FIG. 1 illustrates a cross section 100 of a conventional design with a pinned photodiode having a N+ photosensitive region, adjacent to a P-type well and surrounded just inside a STI. Segmenting a semiconductor P-type substrate 102 is a ring, typically rectangular, of a dielectric STI 104. Adjacent to the inner wall and the bottom of the STI 104 is a ring of diffused P-type well 106. A N+ region 108 is implanted to a substrate surface 110 of the P-type substrate 102.

The N+ region 108 spans the area inside the ring of P-type well 106 such that the N+ region 108 is isolated from the STI 104 by a distance 112, which is the same as the width of the P-type well 106. The P-type well 106, or other diffusion, has a heavier doping than has the P-type substrate 102. A shallow P+ region 114 spans the entire substrate surface 110 of the P-type substrate 102 interior to the P-type well 106, and further overlaps part of the P-type well 106. This overlapping is effectively the P-type pinning implant of the photodiode. It subdues the N+ region 108 beneath the substrate surface 110. Since this P+ region 114 is more heavily doped than is the N+ region 108, the P+ doping overpowers the N+ doping, thereby isolating the N+ region 108 from the substrate surface 110. The purpose of isolating the N+ region from the substrate surface 110 is to further reduce leakage. Here, the junction of the N+ region 108 does not reach the substrate surface 110 where it could cause electrical leakage.

The boundary surfaces between the N+ type interior to the N+ region 108 and the various P-type regions outside that region constitute an electrical junction. For example, the N+ region 108 is enclosed by the P+ region 114 at the top, the P-type well 106 at the sides, and the P-type substrate 102 at the bottom. When this electrical junction is reverse-biased, with a positive bias on the N-type interior and a relatively negative bias on the P-type exterior, the depletion region of the electrical junction expands outward to an outer surface 116 and inward to an inner surface 118.

It is the volume of the depletion region between the outer surface 116 and the inner surface 118 that is the photosensitive element. Within this volume, absorbed light generates paired electrons and holes that are driven in opposite directions and collected as photocurrent. Photocurrent is also collected from within a carrier diffusion length of the depletion region. This larger sensitive volume has slightly slower response.

The pinned photodiode thus has two photosensitive depletion regions that are parallel to the substrate surface 110, one at the top and one at the bottom of the N+ region 108. The upper photosensitive depletion region is closer to the substrate surface 110 and therefore is more responsive to a blue light which has a shorter wavelength. So, this extra photosensitive depletion region at the top of the N+ region 108 increases photosensitivity and shifts the sensitivity towards the blue region of the photo spectrum.

The degree of doping on each side of the electrical junction and the ratio of doping on the two sides of the junction determine the extension of the depletion region in each surface direction. The depletion region expands little, along a portion of the outer surface 116, into the P+ region 114, because of its heavy P-type doping. The depletion region expands slightly further, along a portion of the inner surface 118 into the N+ region 108, because the doping is heavy, but less than the doping of the P+ region 114. The depletion region expands more into the P-type well 106, where the doping is less heavy than that in either the N+ region 108 or the P+ region 114. The depletion region expands the most, along the bottom portion of the outer surface 116, into the P-type substrate 102.

The distance 112 allows space for the depletion to expand, with voltage, into the P-type well 106. It is desired to prevent the depletion region from expanding into any damaged region of the P-type well 106 that is immediately adjacent to the STI 104. This damaged region, typically caused by dry etching of the trench, is a substrate crystal in the P-type well 106 that is immediately adjacent to the STI 104. This damaged region would cause electrical leakage if any portion of the junction depletion region that surrounds the N+ region 108 extends too near to the damage. In conventional structures, however, the depletion region expands into the damaged region causing electrical leakage.

Figure 2:
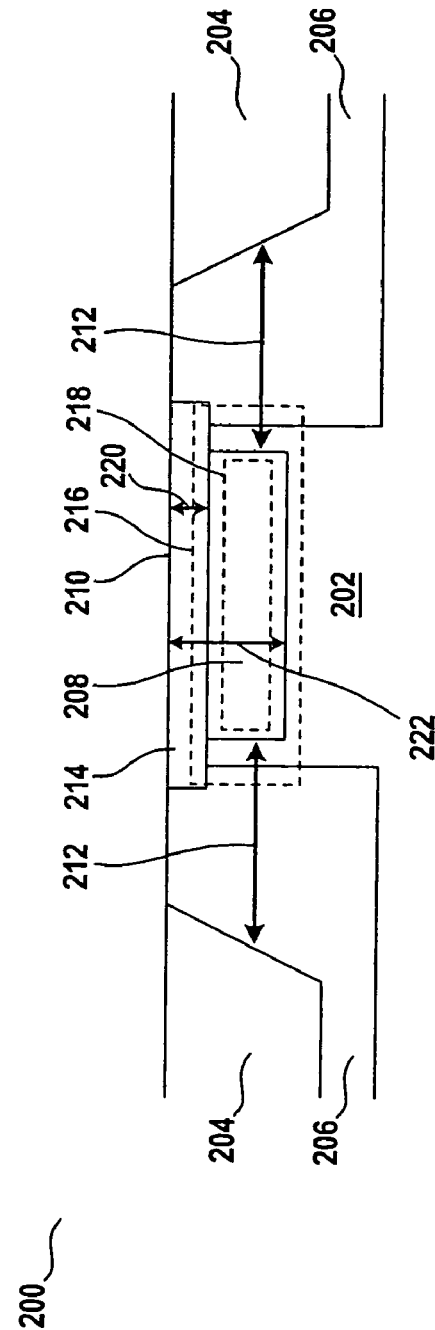
FIG. 2 illustrates a cross section of a pinned photodiode fabricated alongside a shallow trench isolation in accordance with one embodiment of the present invention.

FIG. 2 illustrates a cross section 200 of an improved design with a pinned photodiode fabricated alongside a STI in accordance with one embodiment of the present invention. A space between a N+ photosensitive region of the pinned photodiode and a P-type well surrounding it is extended to further reduce leakage. Segmenting a semiconductor P-type substrate 202 is a ring, typically rectangular, of a dielectric STI 204. Adjacent to the inner wall and the bottom of the STI 204 is a ring of diffused P-type well 206. A N+ region 208 is implanted and diffused from a substrate surface 210 of the P-type substrate 202.

With reference to FIG. 1, the distance 112 separating the N+ region 108 from the STI 104, is the width of the P-type well 106. According to an embodiment of the invention illustrated in FIG. 2, a distance 212 separating the N+ region 208 from the STI 204 is the width of the P-type well 206 plus a space of the P-type substrate 202. In an exemplary embodiment, distance 212 may range from 0.1 um to 0.8 um but may vary in various other exemplary embodiments. The purpose of this space of the P-type substrate 202 is to provide a longer distance between the N+ photosensitive region and the STI to further reduce electrical leakage. Here, the depletion region expands somewhat with voltage into the space of the P-type substrate 202 before it encounters the heavier doping of the P-type well 206. In this embodiment, a little more voltage means a little additional expansion of the depletion region into the P-type well 206. In other words, the space provides additional protection from leakage because the depletion region does not approach as closely to any damaged semiconductor crystal that lies in a boundary between the STI 204 and the P-type well 206 as to a conventional pinned photodiode design.

The P-type well 206, or other diffusion, has heavier doping than has the P-type substrate 202. This heavier doping prevents the depletion region that surrounds the N+ region 208 from extending to the damaged material at the boundary between the P-type well 206 and the STI 204. Some of the P-type substrate 202 material can be left to occupy the space. The part of the substrate crystal in the P-type well 206, immediately adjacent to the STI 204, is damaged by a dry etch operation producing it. This would cause electrical leakage if any portion of the junction depletion region that surrounds the N+ region 208 extends too near to the damage. The spacing of distance 212 allows more voltage to be applied to form a larger depletion region to improve sensitivity of the photodiode without concern that the depletion region will expand laterally into the damaged region of the P-type well that is immediately adjacent STI 204 and cause leakage.

A shallow P+ region 214 spans the entire substrate surface 210 of the P-type substrate 202 interior to the ring of the P-type well 206, and further overlaps the P-type well 206. This overlapping is essentially the P-type pinning implant of the photodiode. The P+ region 214 subdues the N+ region 208 beneath the substrate surface 210. The P+ region 214 advantageously includes a higher impurity concentration than P-type well 206. Since this P+ region 214 is more heavily doped than is the N+ region 208, the P+ doping overpowers the N+ doping, while the P+ region 214 isolates the N+ region 208 from the substrate surface 210. The purpose of isolating the N+ region from the substrate surface 210 is to further reduce leakage. Here, the junction of the N+ region 208 does not reach the substrate surface 210 where it could cause electrical leakage.

The N+ region 208 is isolated beneath the substrate surface 210. The boundary surfaces between the N+ type interior of the N+ region 208 and the various P-type regions outside it constitute an electrical junction. As shown, the N+ region 208 is surrounded by a P-type area comprising the P+ region 214 on top and portions of the P-type substrate 202 on all other sides. When the electrical junction is reverse-biased, with a positive bias on the N-type interior and a relatively negative bias on the P-type exterior, the depletion region of the electrical junction expands outward to an outer surface 216 and inward to an inner surface 218. As it can be seen, the depletion region defined by the outer surface 216 and inner surface 218 is bigger than that in the prior art, and it helps to absorb short wavelength lights such as the blue light. In an exemplary embodiment, the width of the depletion region, i.e., the perpendicular distance between outer surface 216 and inner surface 218, may range from 0.01 to 0.2 microns. Distance 212 is chosen so that, when the depletion region expands to a maximum expansion width, it does not reach the damaged region adjacent the STI 204, which faces the N+ region 208. The maximum expansion width of the depletion region may range from 0.05 to 0.7 microns in one exemplary embodiment, but may vary in other exemplary embodiments.

Provided is a pinned photodiode that isolates the photosensitive junction area from the surface of the semiconductor substrate, thereby reducing the leakage that would otherwise be generated by the meeting of the electrical junction and the imperfect interface between the semiconductor crystal and the oxide. Some structure that provides heavier doping adjacent to the surrounding STI reduces leakage that otherwise would be generated by the meeting of the junction depletion region and the substrate material damaged by the dry etching that produces the STI. By including an additional space between the photodiode and the surrounding heavy doping structure, leakage is reduced, thereby improving image quality produced by the photodiode.

Figure 3:
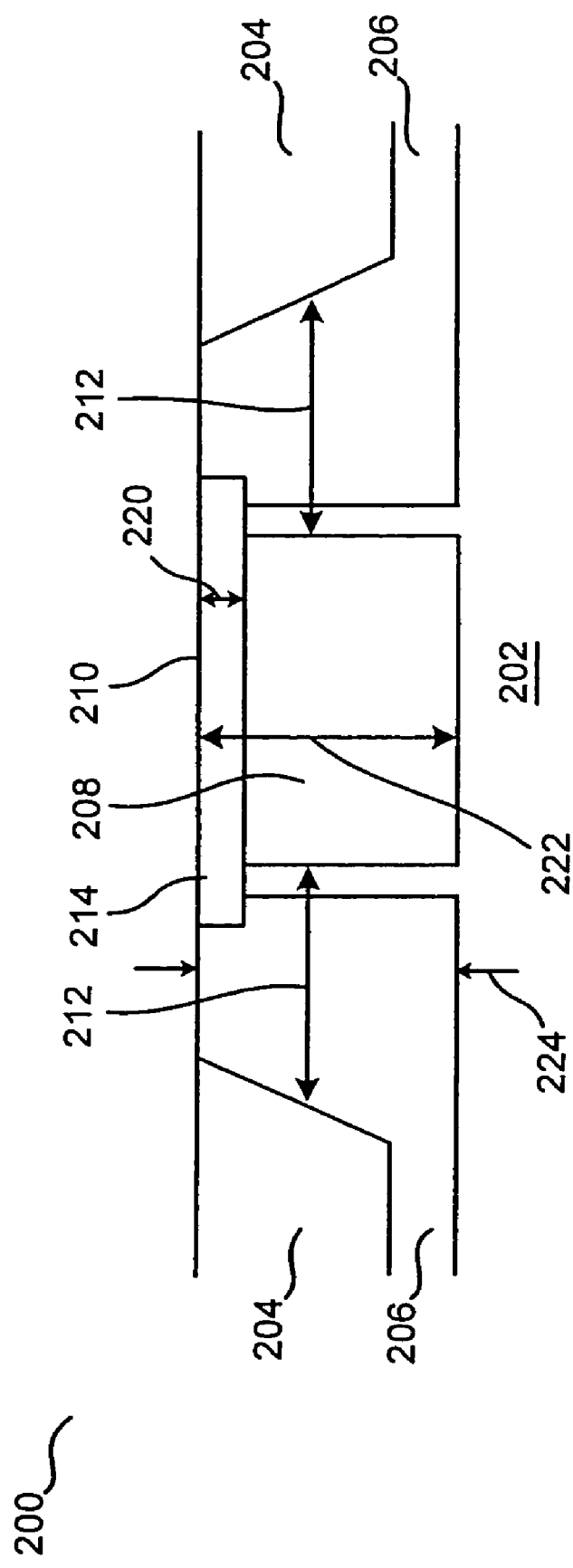
FIG. 3 illustrates a cross section of a pinned photodiode fabricated alongside a shallow trench isolation in accordance with a further embodiment of the present invention.

FIG. 3 shows another exemplary pinned photodiode in which the N+ region 208 extends to the same depth as the P-type wells 206. Like reference numerals denote like features throughout the specification and it can be seen that N+ region 208 includes a greater relative depth 222 than in FIG. 2. The depletion region, described in conjunction with FIGS. 1 and 2, is not shown.

The sensitivities of the various pinned photodiodes may be optimized for detection of different wavelengths of light. Longer wavelength light is absorbed by deeper junctions so the structures and associated depletion regions may be so formed. For example, for the detection of red light, the junction between the N+ region 208 and the P-type substrate 202 (depth 222) may be about 0.8 microns or greater. For the optimal detection of blue light, the junction between P+ region 214 and N+ region 208 (depth 220) may be less than about 0.2 microns. In another embodiment illustrated in FIG. 3, a pinned photodiode optimized for the detection of green light may include the N+ region 208/P-type substrate 202 depth being substantially equal to the depth 224 of the P-type wells and about 0.2 to 0.8 microns.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method to reduce or eliminate electrical leakage between a pinned photodiode and shallow trench isolation fabricated therewith, the method comprising:
   implanting N+ impurities to form an N+ region beneath a surface of a P-type semiconductor substrate;
   forming at least one shallow trench isolation (STI) structure in the semiconductor substrate;
   forming at least one P-type well laterally separating the N+ region from each STI structure wherein a substrate portion of the semiconductor substrate remains interposed between the N+ region and each P-type well and the P-type well includes a damaged portion adjacent the STI and facing the N+ region;
   forming a P+ region covering the N+ region and each substrate portion and overlapping at least part of each P-type well, the P+ region formed within the semiconductor substrate and extending downwardly from the surface;
   creating an expandable depletion region along a boundary between the N+ region and the substrate portion,
   laterally spacing the N+ region from each adjacent damaged portion by a distance sufficient to prevent the depletion region from expanding into the associated damaged portion when the depletion region expands to a maximum expansion width, and
   the N+ region having a lower boundary more than about 0.8 microns below the surface.

2. The method of claim 1, further comprising reverse-biasing a junction of the N+ region and the substrate portion by providing a relatively positive bias in the N+ region and a relatively negative bias in the substrate portion thereby causing the depletion region to expand outwardly to a boundary between the N+ region and the damaged portion.

3. The method of claim 1, wherein the forming at least one STI structure comprises dry etching and the damaged portion is caused by the dry etching.

4. The method of claim 1, wherein the forming a P+ region comprises implanting and the P+ region has a higher impurity concentration than the N+ region.

5. A method to reduce or eliminate electrical leakage between a pinned photodiode and shallow trench isolation fabricated therewith, the method comprising:
   implanting N+ impurities to form an N+ region beneath a surface of a P-type semiconductor substrate;
   forming at least one shallow trench isolation (STI) structure in the semiconductor substrate;
   forming at least one P-type well laterally separating the N+ region from each STI structure wherein a substrate portion of the semiconductor substrate remains interposed between the N+ region and each P-type well and the P-type well includes a damaged portion adjacent the STI and facing the N+ region;
   forming a P+ region covering the N+ region and each substrate portion and overlapping at least part of each P-type well, the P+ region formed within the semiconductor substrate and extending downwardly from the surface;

creating an expandable depletion region along a boundary between the N+ region and the substrate portion, laterally spacing the N+ region from each adjacent damaged portion by a distance sufficient to prevent the depletion region from expanding into the associated damaged portion when the depletion region expands to a maximum expansion, and forming the P+ region to have a lower boundary extending no more than 0.2 microns below the surface.

6. The method of claim 5, further comprising reverse-biasing a junction of the N+ region and the substrate portion by providing a relatively positive bias in the N+ region and a relatively negative bias in the substrate portion thereby causing the depletion region to expand outwardly to a boundary between the N+ region and the damaged portion.

7. A method to reduce or eliminate electrical leakage between a pinned photodiode and shallow trench isolation fabricated therewith, the method comprising:

implanting N+ impurities to form an N+ region beneath a surface of a P-type semiconductor substrate;

forming at least one shallow trench isolation (STI) structure in the semiconductor substrate;

forming at least one P-type well laterally separating the N+ region from each STI structure wherein a substrate portion of the semiconductor substrate remains interposed between the N+ region and each P-type well and the P-type well includes a damaged portion adjacent the STI and facing the N+ region;

forming a P+ region covering the N+ region and each substrate portion and overlapping at least part of each P-type well, the P+ region formed within the semiconductor substrate and extending downwardly from the surface;

creating an expandable depletion region along a boundary between the N+ region and the substrate portion, laterally spacing the N+ region from each adjacent damaged portion by a distance sufficient to prevent the depletion region from expanding into the associated damaged portion when the depletion region expands to a maximum expansion, and forming each of the N+ region and each at least one P-type well to have the substantially same lower boundary being about 0.2 to 0.8 microns below the surface.

8. The method of claim 7, wherein the forming at least one STI structure comprises dry etching and the damaged portion is caused by the dry etching, the forming a P+ region comprises implanting, the P+ region has a higher impurity concentration than the N+ region, and further comprising reverse-biasing a junction of the N+ region and the substrate portion by providing a relatively positive bias in the N+ region and a relatively negative bias in the substrate portion thereby causing the depletion region to expand outwardly to a boundary between the N+ region and the damaged portion.

* * * * *